May 7, 1957 C. E. BESSEY 2,791,645
TRANSISTOR AMPLIFIER
Filed May 4, 1954 2 Sheets-Sheet 1

INVENTOR.
CARLTON E. BESSEY
BY
Harry M. Saragovitz
ATTORNEY

*INVENTOR.*
CARLTON E. BESSEY
*BY*

*ATTORNEY*

United States Patent Office 2,791,645
Patented May 7, 1957

2,791,645

TRANSISTOR AMPLIFIER

Carlton E. Bessey, Little Silver, N. J., assignor to the United States of America as represented by the Secretary of the Army Application May 4, 1954, Serial No. 427,680

5 Claims. (Cl. 179—171)

(Granted under Title 35, U. S. Code (1952), sec. 266)

The invention described herein may be manufactured and used by or for the Government for governmental purposes, without the payment of any royalty thereon.

Subject invention relates to transistor amplifiers and more particularly to transistor amplifiers connected in complementary symmetry to provide a push-pull output.

The subject invention includes a means for automatically varying the bias of the input voltage with the output current drain to automatically provide optimum operating conditions.

In conventional transistor circuitry separate bias supplies are normally provided for both the emitter and collector voltages. These are designed to be correct for the normal operating conditions and characteristics of a given transistor. Under constant conditions transistors are relatively stable but as the ambient temperature of the transistor increases either through changes in local atmospheric conditions or the heat generated due to its own internal losses, the operating characteristics of the transistor change to cause an increase in collector current. This increase in collector current tends to increase the heat losses of the transistor to further increase the ambient temperature, drawing the transistor beyond optimum operating range and occasionally burning out the transistor.

It is therefore an object of this invention to provide an automatic transistor biasing arrangement.

It is a further object of this invention to provide a biasing means for transistors that will automatically compensate for changes in the operating conditions of the transistors.

It is a further object of this invention to provide a means for biasing the emitters in a push-pull transistor circuit without requiring a separate source of potential.

It is a further object of this invention to provide a push-pull biasing system that automatically compensates for changes in balance between the two sides.

It is a further object of this invention to provide a push-pull transistor biasing system that may be employed as a feedback network for either positive or negative feedback.

Other and further objects of this invention will become apparent from the following specification and the drawings in which Figures 1, 2, 3 and 4 show circuit diagrams of typical embodiments of this invention.

Figure 1:
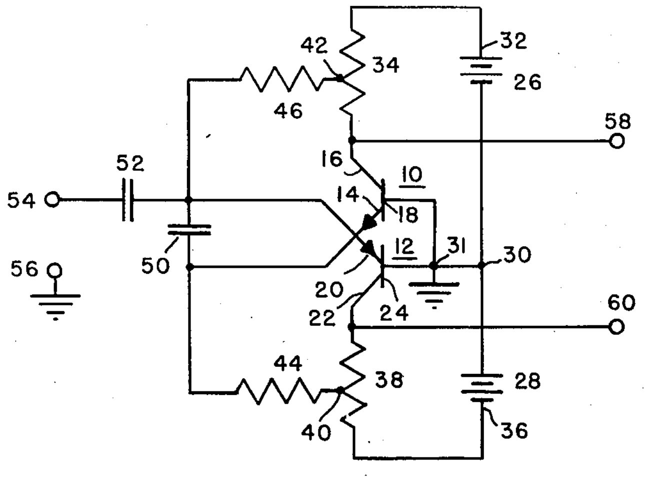

Referring more particularly to Figure 1, transistors 10 and 12 are connected in a complementary symmetry, push-pull arrangement. In this circuit transistor 10 is of the type commonly designated NPN, and transistor 12 is of the type designated as PNP. Transistor 10 has an emitter electrode 14 and collector electrode 16 and a base electrode 18. Transistor 12 has an emitter electrode 20, a collector 22 and a base electrode 24.

The power supply for this amplifier is the batteries 26 and 28 which may be separate or a single, center tapped battery. Under certain conditions the grounded center tap 30 may be omitted and a single battery used. The positive terminal 32 of the battery 26 connects through the load 34 to the collector 16 of transistor 10. Current from the battery passes through to the base 18 of transistor 10 whose impedance is controlled by variations in the voltage of the emitter 14. Similarly, the battery 28 has its negative terminal 36 connected to the load resistance 38 which is in series with a collector 22 of transistor 12. The impedance of transistor 12 is controlled by the emitter 20.

To obtain a correct bias voltage for transistor 10 the voltage drop across load 38 of transistor 12 is tapped at a given point 40. The voltage drop across this fraction of the load resistance provides the correct operating bias at the correct polarity for the emitter of transistor 10. Similarly the bias voltage for the emitter of transistor 12 is taken from point 42 of the load resistance 34 of transistor 10. The emitter 20 is decoupled from point 42 by the impedance 46, which is equivalent to the grid load resistor of conventional vacuum tube circuitry. The impedance 44 provides a similar function for emitter 14.

Since complementary symmetry conections are employed in this transistor amplifier the voltage inputs to the emitters 14 and 20 are in phase while the outputs of the collectors 16 and 22 are out of phase. These out-of-phase voltages are fed back through resistances 44 and 46 to the corresponding emitters 14 and 20. Since the input is single phase, one of the emitters would receive a positive feedback and the other emitter would receive a negative feedback. To avoid this effect, and since the emitters are being driven by a common voltage, they are connected together through condenser 50 which provides a short circuit for the opposing alternating voltages built up across resistors 44 and 46. When the circuit is in a balanced condition the alternating current feedback voltage to the common emitters 14 and 20 is zero.

It will be obvious to anyone skilled in the art that by varying the ratio of the impedance networks 44 and 46 any desired degree and polarity of feedback can be provided. It will also be obvious that suitable frequency sensitive networks can be employed in any of the innumerable ways available in vacuum tube circuitry to provide tone control or filtering action.

The condenser 52 coupled the emitters 14 and 20 to the input terminal 54, which will provide a voltage with respect to the ground terminal 56. Output is provided in push-pull across the collectors 16 and 22 at terminals 58 and 60.

The ground terminals 18 and 24 of transistors 10 and 12 are connected together and may be grounded along with the center tap 30 of batteries 26 and 28. However, it is apparent that once properly balanced this circuit may effectively float with the base electrodes of the transistors at effectively ground potential or merely shorted to ground for alternating current purposes.

Figure 2:
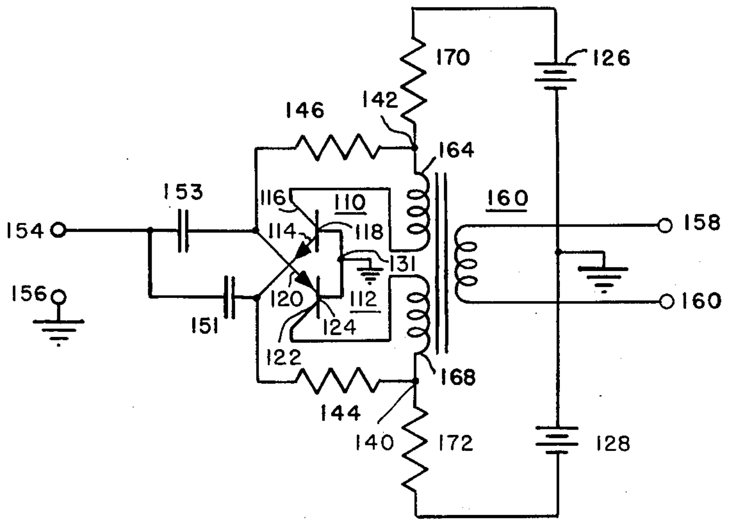

Figure 2 is similar in general circuitry to Figure 1, and in Figure 2 the elements identical in function to the elements of Figure 1 are similarly numbered. In Figure 2 the transistors 110 and 112 are coupled to batteries 126 and 128 through voltage dividing networks which supply the correct bias to the input circuits of the opposite transistors through resistances 144 and 146. In this case the voltage dividers include the primary windings of transformer 160 and resistances 170 and 172. The primary winding 164 connects to resistance 170, at point 142. The resistance 146 connects the potential of point 142 as a direct-current bias for the emitter 120 of transistor 112. Similarly the primary winding 168 is joined to resistor 172 at point 140 which supplies the bias to the emitter 114 of transistor 110 through resistance 144.

The bases of the transistors 110 and 112 are connected together at point 131, which may be grounded. The emitters 114 and 120 may each be connected to the input terminal 154 through a corresponding one of the condensers 151 and 153. For most alternating-current frequencies there will be little difference between this system of connecting the emitters to the input terminal and the system of Figure 1 of connecting emitters together through condenser 50 and connecting one of the emitters to the input terminal through condenser 52.

The use of a transformer with the transistors may provide a better impedance match and higher efficiency of coupling to the transistor as well as to the output. It should be noted in this case that the bias voltages could be obtained from suitable taps on the primaries of the transformer windings 164 and 168, thereby eliminating the resistors 170 and 172.

Figure 3:
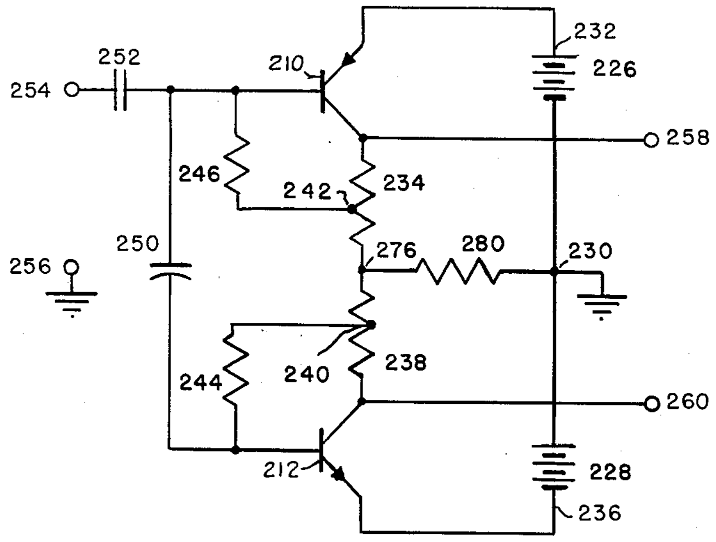
Figure 4:
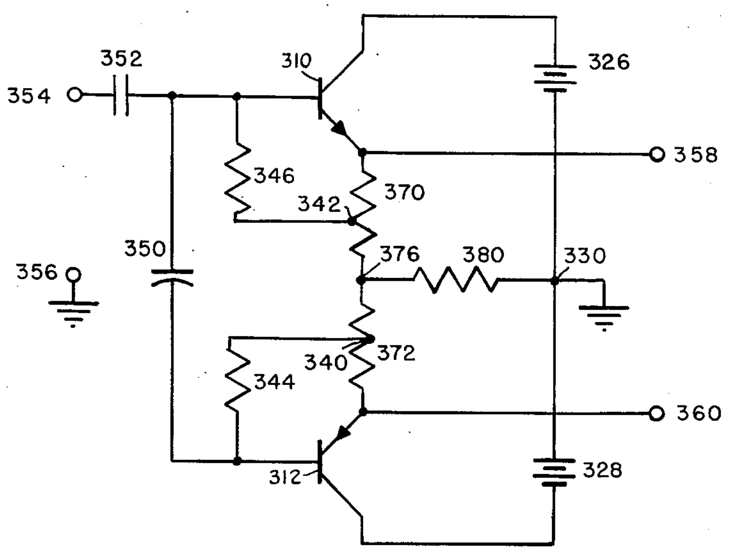

Figures 3 and 4 are similar to Figure 1, and the elements having the same function are similarly numbered. In Figures 3 and 4 the position of the transistors and the loads are reversed with the neutral points 276 and 376 appearing between the loads instead of between the transistors. The neutral points 276 and 376 now replace the common connections 31 and 131 of the transistor bases.

In Figure 3, a first transistor 210 of the PNP variety has its emitter connected to the positive terminal 232 of battery 226. The collector terminal of transistor 210 is connected through a load resistance 234 to a neutral point 276. The second transistor 212, which may be of the NPN variety, has its emitter connected to the negative terminal 236 of the battery 228 whose positive terminal is connected to the negative terminal of battery 226, or to a common ground point 230. The collector of the transistor 212 is connected through the load resistance 238 to the neutral point 276.

The bias voltage for transistor 210 is taken from a suitable tap 242 on the load resistance 234. The bias voltage is supplied to the base electrode of transistor 210 through the resistor 246. The bias voltage for the base electrode of the transistor 212 is supplied through the decoupling resistor 244 to a suitable tap 240 on the load resistor 238. Since the transistors have a complementary symmetrical arrangement, both base electrodes may be coupled to a common input terminal 254 through decoupling condensers 252 and 250.

In Figure 4, the circuit is substantially identical and similar elements are similarly numbered. The transistors used in Fig. 4 are reversed with respect to those of Fig. 3, with 310 being the NPN type and 312 being the PNP type transistor. The loads 370 and 372 in Fig. 4 are connected in the emitter circuits instead of the collector circuits, and the supply voltages from batteries 326 and 328 are connected to the collector electrodes.

In Figure 3, the output voltages are taken in push-pull across the collectors of transistors 210 and 212 at points 258 and 260. The output voltages of Fig. 4, at points 358 and 360, are taken across the emitters of transistors 310 and 312.

The derivation of the bias voltage from its own load resistance for each transistor in Figs. 3 and 4 provides a degenerative feed-back to the corresponding input. This will reduce the effects of temperature changes on the operation of the transistors, or any inherent mismatch of the transistors themselves in either static or dynamic characteristics.

Since alternating components of the opposing negative feed-back signals are shorted together through condenser 250, at the common input 254, equal feed-back signals will be cancelled. Any inequality in the output voltage in either a positive or negative sense will be fed back to the input to balance the inequality. At the same time, any desired amount of negative or positive feed-back is available.

As mentioned earlier in regard to Figs. 1 and 2, since both positive and negative output signals are available, any polarity of feedback, either positive or negative, may be utilized in any manner known to the prior art to produce oscillation or degeneration or to achieve high or low pass filters such as found in tone controls.

In this case the neutral points are connected to the center taps 230 and 330 between the batteries 226 and 228, and 326 and 328 through the balancing resistors 280 and 380. The point 276 will be at ground potential when the two loads are balanced, but should either arm of the symmetrical bridge vary unequally due to changes in the characteristics of the transistors or ambient temperatures relative thereto the potential of point 276 will vary with respect to the ground point 230, or current will pass through the resistor 280 in the direction necessary to compensate for the inequalities in voltage.

Having thus described my invention, what is claimed is:

1. In a transistor amplifier, a PNP transistor having emitter, collector and base electrodes, an NPN transistor having emitter, collector and base electrodes, said base electrodes connected together, a source of positive potential with respect to the base of said NPN transistor, a source of negative potential with respect to the base of said PNP transistor, a first load impedance having a voltage dividing tap connecting said NPN collector to said source of positive potential, a second load impedance having a voltage dividing tap connecting said PNP collector to said source of negative potential, a first decoupling resistor connecting the emitter of said PNP transistor to the voltage dividing tap of said first load impedance, a second decoupling resistor connecting the emitter of said NPN transistor to the voltage dividing tap of said second load impedance, a condenser connected between the emitters of said transistors, an input connected to one of said emitters and output terminals connected to the collectors of said transistors.

2. In a transistor amplifier a PNP transistor having emitter, collector and base electrodes, a NPN transistor having emitter, collector and base electrodes, said base electrodes connected together, a first condenser connecting said emitter electrodes, a source of potential having positive and negative terminals, a first voltage divider connecting the collector of said NPN transistor to said positive terminal and having a voltage dividing tap, a second voltage divider connecting the collector of said PNP transistor to said negative terminal and having a voltage dividing tap, a first resistor connecting the voltage dividing tap of said first voltage divider to the emitter of said PNP transistor and a second resistor connecting the tap of said second voltage divider to the emitter of said NPN transistor, a second condenser, a source of input signals connected through said second condenser to one of said emitters and output terminals connected to said collectors.

3. A transistor amplifier comprising a PNP transistor having emitter, collector, and base electrodes, a NPN transistor having emitter, collector and base electrodes, said base electrodes connected together and grounded, a push-pull transformer having first and second input windings and an output winding, a source of potential having positive and negative terminals, a first impedance connected in series with a first of said transformer windings between said positive terminal and the collector of said NPN transistor, a second impedance connected in series with the second of said transformer windings between said negative terminal and the collector of said PNP transistor, a source of input signals, a first condenser connecting said source of input signals to one of said emitters, a second condenser connecting said source of input signals to the other of said emitters, a third impedance connecting said NPN emitter to the junction of said first impedance and winding and a fourth impedance connecting said PNP emitter to the junction of said second impedance and transformer winding.

4. A transistor amplifier comprising: a PNP transistor having emitter, collector and base electrodes, a NPN transistor having emitter, collector and base electrodes, said base electrodes connected together, a push-pull transformer having first and second primary windings and a secondary winding, one terminal of each of said primary windings connected to one of said collectors, load impedances having a first terminal connected to each of the second terminals of said primary windings, a source of potential connected across the other terminals of said load impedances, decoupling resistors connecting the first terminals of said load impedances to the emitters of the transistors associated with the opposite primary windings, a source of input voltage and condensers connecting said source of input voltage to said emitters.

5. A transistor amplifier comprising: a first PNP transistor having input and output electrodes, a second NPN transistor having input and output electrodes, a first tapped load impedance connected to said PNP transistor output, a second tapped load impedance connected to said NPN transistor output, a source of potential having a center tap, said first transistor and its load impedance connected in series with said second transistor and its load impedance across said source of potential, a third impedance connecting the input of said PNP or first transistor to the tap of said second load impedance, a fourth impedance connecting the input of said second transistor to the tap of said first load impedance, and a condenser coupling the inputs of said transistors.

References Cited in the file of this patent

UNITED STATES PATENTS

| | | |
|---|---|---|
| 2,517,960 | Barney et al. | Aug. 8, 1950 |
| 2,663,766 | Meacham | Dec. 22, 1953 |
| 2,666,818 | Shockley | Jan. 19, 1954 |
| 2,666,819 | Raisbeck | Jan. 19, 1954 |

OTHER REFERENCES

Sziklai article, Proc. IRE, June 1953, pp. 717–724.